US007061279B1

(12) United States Patent
Leete

(10) Patent No.: US 7,061,279 B1
(45) Date of Patent: Jun. 13, 2006

(54) SYSTEM AND METHOD FOR HIGH FREQUENCY, HIGH OUTPUT SWING BUFFERS

(75) Inventor: John Leete, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/026,372

(22) Filed: Dec. 30, 2004

(51) Int. Cl.
*H03K 5/22* (2006.01)
(52) U.S. Cl. .................. 327/65; 327/108; 327/563
(58) Field of Classification Search ........ 327/108–112, 327/560, 563; 330/252–255, 261, 277, 301, 330/302; 326/82–92; 360/46, 67, 68; 363/58, 363/63
See application file for complete search history.

(56) References Cited

U.S. PATENT DOCUMENTS

| | | | | |
|---|---|---|---|---|
| 5,559,507 A | * | 9/1996 | Beigel ...................... 340/10.34 |
| 6,005,438 A | * | 12/1999 | Shing ......................... 330/253 |
| 6,340,899 B1 | * | 1/2002 | Green ......................... 326/115 |
| 6,392,486 B1 | * | 5/2002 | Lemay, Jr. .................. 330/253 |
| 6,549,071 B1 | * | 4/2003 | Paul et al. .................. 330/252 |
| 6,608,527 B1 | * | 8/2003 | Moloudi et al. ............ 330/301 |
| 6,741,121 B1 | * | 5/2004 | Huber ......................... 327/563 |
| 6,791,393 B1 | * | 9/2004 | Underhill .................... 327/379 |

* cited by examiner

*Primary Examiner*—Long Nguyen
*Assistant Examiner*—Ryan Jager
(74) *Attorney, Agent, or Firm*—McAndrews, Held & Malloy, Ltd.

(57) ABSTRACT

Methods and systems for increasing gain for an electric circuit may include receiving an input differential signal at a first configured pair of transistors and a second configured pair of transistors. The first and second configured pair of transistors may be inductively loaded. The first configured pair of transistors may be self-biased via the inductive loading. DC current may be generated via the second configured pair of transistors. The first and/or the second configured pair of transistors may be configured as input transconductors. A pair of inductors may be configured for the inductive loading and the configured pair of inductors may be tapped for the self-biasing. If the first configured pair of transistors comprises NMOS transistors, then the second configured pair of transistors may comprise PMOS transistors.

45 Claims, 8 Drawing Sheets

SYSTEM AND METHOD FOR HIGH FREQUENCY, HIGH OUTPUT SWING BUFFERS

RELATED APPLICATIONS

This application makes reference to U.S. patent application Ser. No. 10/976,996, filed Oct. 29, 2004, which is incorporated herein by reference in its entirety for all purposes.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to the processing of radio signals in a transceiver. More specifically, certain embodiments of the invention relate to a system and method for high frequency, high output swing buffers.

BACKGROUND OF THE INVENTION

A local oscillator generator (LOGEN) circuit is utilized in a conventional transceiver to generate oscillator reference signals. The oscillator reference signals generated by the LOGEN circuit are utilized by a transmitter and/or a receiver. Since different reference frequencies may be utilized for transmitter and/or receiver operations, multiple local oscillator generators are utilized in conventional transceivers. For example, one or more LOGEN circuits may be utilized by a transmitter block and one or more LOGEN circuits may be utilized by a receiver block within a transceiver. For each LOGEN circuit, a conventional transceiver utilizes one or more calibration circuits that calibrate the LOGEN circuit for a specific frequency or a range of frequencies.

The LOGEN circuits within the transmitter and/or receiver block, however, occupy significant on-chip real estate within a conventional transceiver. In addition, additional on-chip real estate is required for the calibration circuits corresponding to each of the LOGEN circuits utilized within the transceiver. Further, by utilizing several LOGEN circuits, there is an increased possibility of inter-oscillator interference, which causes ineffective oscillator signal generation and decreases efficiency.

LOGEN circuits may be adapted to utilize one or more voltage controlled oscillators (VCOs). The VCOs may be adapted to generate one or more differential frequency outputs and may be followed by one or more divider circuits that divide the generated differential frequency outputs. The VCOs, however, are sensitive to loading from following divider circuits and/or other interconnections. For example, large capacitance and/or resistance created by dividers and line routing limit VCO performance. Conventional LOGEN circuits, therefore, utilize buffers to provide the VCO with a known, reasonable load impedance and enough power to drive any dividers and interconnections with the large signal these devices require to operate correctly.

Buffers within conventional LOGEN circuits utilize one or more transistors as transconductors. In addition, resistors are used to isolate buffer inputs and/or outputs, as well as for biasing loading circuits within the buffer. Each of these resistors, however, contribute to an increase in parasitic capacitance and overall excess loading of the buffer outputs. Further, bias setting resistors, as well as direct current (DC) voltage source transistors within the buffer, utilize significant headroom to function properly. Consequently, as supply voltages within integrated circuits containing conventional buffers decrease with improvements in radio signal processing technology, gain and output swing characteristics of the buffer decreases.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Certain embodiments of the invention may be found in a method and system for increasing gain for an electric circuit. Aspects of the method may comprise receiving an input differential signal at a first configured pair of transistors and a second configured pair of transistors. The first and second configured pair of transistors may be inductively loaded. The first configured pair of transistors may be self-biased via the inductive loading. DC current may be generated via the second configured pair of transistors. The first and/or the second configured pair of transistors may be configured as input transconductors. A pair of inductors may be configured for the inductive loading and the configured pair of inductors may be tapped for the self-biasing. If the first configured pair of transistors comprises NMOS transistors, then the second configured pair of transistors may comprise PMOS transistors. If the first configured pair of transistors comprises PMOS transistors, then the second configured pair of transistors may comprise NMOS transistors.

In another embodiment of the invention, an apparatus for increasing output gain of an electronic circuit may comprise a first configured pair of transistors and a second configured pair of transistors that each receives input differential signals. The apparatus may also comprise an inductive load that may inductively load the configured pair of transistors and the second configured pair of transistors. The inductive load may self-bias the first configured pair of transistors. The second configured pair of transistors may generate DC current. The first and/or the second configured pair of transistors may be configured as input transconductors. The inductive load may further comprise a pair of inductors for the inductive loading. The apparatus may further comprise a tap that may tap the configured pair of inductors for the self-biasing. If the first configured pair of transistors comprises NMOS transistors, then the second configured pair of transistors may comprise PMOS transistors. If the first configured pair of transistors comprises PMOS transistors, then the second configured pair of transistors may comprise NMOS transistors.

In another embodiment of the invention, the method may comprise biasing a first transistor and a second transistor of a buffer and generating a common mode output via a direct current (DC) voltage source for the biasing of the first transistor and the second transistor. A gate of the first transistor may be coupled to a first differential input of the buffer and a gate of the second transistor may be coupled to a second differential input of the buffer. A gate of a third transistor may be coupled to the first differential input of the buffer and a gate of a fourth transistor may be coupled to the second differential input of the buffer. The DC voltage source may be coupled to the third transistor and the fourth transistor.

The common mode output of the DC voltage source may be coupled to the gate of the first transistor and the gate of the second transistor. The first transistor and the second transistor may comprise NMOS transistors and/or PMOS transistors. In an embodiment of the invention, if the first transistor and the second transistor comprise NMOS transistors, then the third transistor and the fourth transistor may comprise PMOS transistors. In an alternate embodiment of the invention, if the first transistor and the second transistor comprise PMOS transistors, then the third transistor and the fourth transistor may comprise NMOS transistors. The third transistor and the fourth transistor may be biased by the common mode output of the DC voltage source for the buffer. A load inductor may be coupled to the DC voltage source. A first terminal of a first resistor may be coupled to the gate of the first transistor and a second terminal of the first resistor may be coupled to the common mode output of the DC voltage source.

A first terminal of a second resistor may be coupled to the gate of the second transistor and a second terminal of the second resistor may be coupled to the common mode output of the DC voltage source. A first terminal of a load inductor may be coupled to a drain of the first transistor and a drain of the third transistor, and a second terminal of the load inductor may be coupled to a drain of the second transistor and a drain of the fourth transistor. The gate of the first transistor may be coupled to a first capacitor and the gate of the second transistor may be coupled to a second capacitor. The gate of the third transistor may be coupled to a third capacitor and the gate of the fourth transistor may be coupled to a fourth capacitor. A source of the first transistor and a source of the second transistor may be coupled to ground.

In an exemplary embodiment of the invention, an apparatus for increasing gain for an electric circuit may comprise a first transistor, a second transistor, a third transistor, and a fourth transistor. A gate of the first transistor may be coupled to a first differential input of a buffer and a gate of the second transistor may be coupled to a second differential input of the buffer. A gate of the third transistor may be coupled to the first differential input of the buffer and a gate of the fourth transistor may be coupled to the second differential input of the buffer. The first transistor and the second transistor may be biased by a common mode output of a direct current (DC) voltage source for the buffer. The DC voltage source may be coupled to the third transistor and the fourth transistor, and the common mode output of the DC voltage source may be coupled to the gate of the first transistor and the gate of the second transistor.

The first transistor and the second transistor may comprise NMOS transistors and/or PMOS transistors. In one embodiment of the invention, if the first transistor and the second transistor comprise NMOS transistors, then the third transistor and the fourth transistor may comprise PMOS transistors. In an alternate embodiment of the invention, if the first transistor and the second transistor comprise PMOS transistors, then the third transistor and the fourth transistor may comprise NMOS transistors. The third transistor and the fourth transistor may be biased by the common mode output of the DC voltage source of the buffer. A load inductor may be coupled to the DC voltage source. A first terminal of a first resistor may be coupled to the gate of the first transistor and a second terminal of the first resistor may be coupled to the common mode output of the DC voltage source.

A first terminal of a second resistor may be coupled to the gate of the second transistor and a second terminal of the second resistor may be coupled to the common mode output of the DC voltage source. A first terminal of a load inductor may be coupled to a drain of the first transistor and a drain of the third transistor and a second terminal of the load inductor may be coupled to a drain of the second transistor and a drain of the fourth transistor. The gate of the first transistor may be coupled to a first capacitor and the gate of the second transistor may be coupled to a second capacitor. The gate of the third transistor may be coupled to a third capacitor and the gate of the fourth transistor may be coupled to a fourth capacitor. A source of the first transistor and a source of the second transistor may be coupled to ground.

These and other features and advantages of the present invention may be appreciated from a review of the following detailed description of the present invention, along with the accompanying figures in which like reference numerals refer to like parts throughout.

DETAILED DESCRIPTION OF THE INVENTION

Certain aspects of the invention may be found in a method and system for increasing gain for an electric circuit. A high frequency inductively loaded buffer may utilize a differential inductor and complementary NMOS and PMOS input transconductors resulting in high output voltage swing and, therefore, higher output gain for the buffer. Differential input signals may be coupled to both the NMOS and PMOS complementary pairs. One pair of transistors may be utilized as input transconductors and may be self-biased from a center tap of the differential inductor. The second pair of transistors may be coupled to a direct current (DC) voltage source and may be utilized as a DC current source as well as input transconductors. By utilizing two input transconductors for each differential input of the buffer, output voltage swing may be substantially increased without any increase in the current through the complementary transistor pairs. By increasing the output voltage swing, the signal gain for the electric circuit may also be increased.

Figure 1:
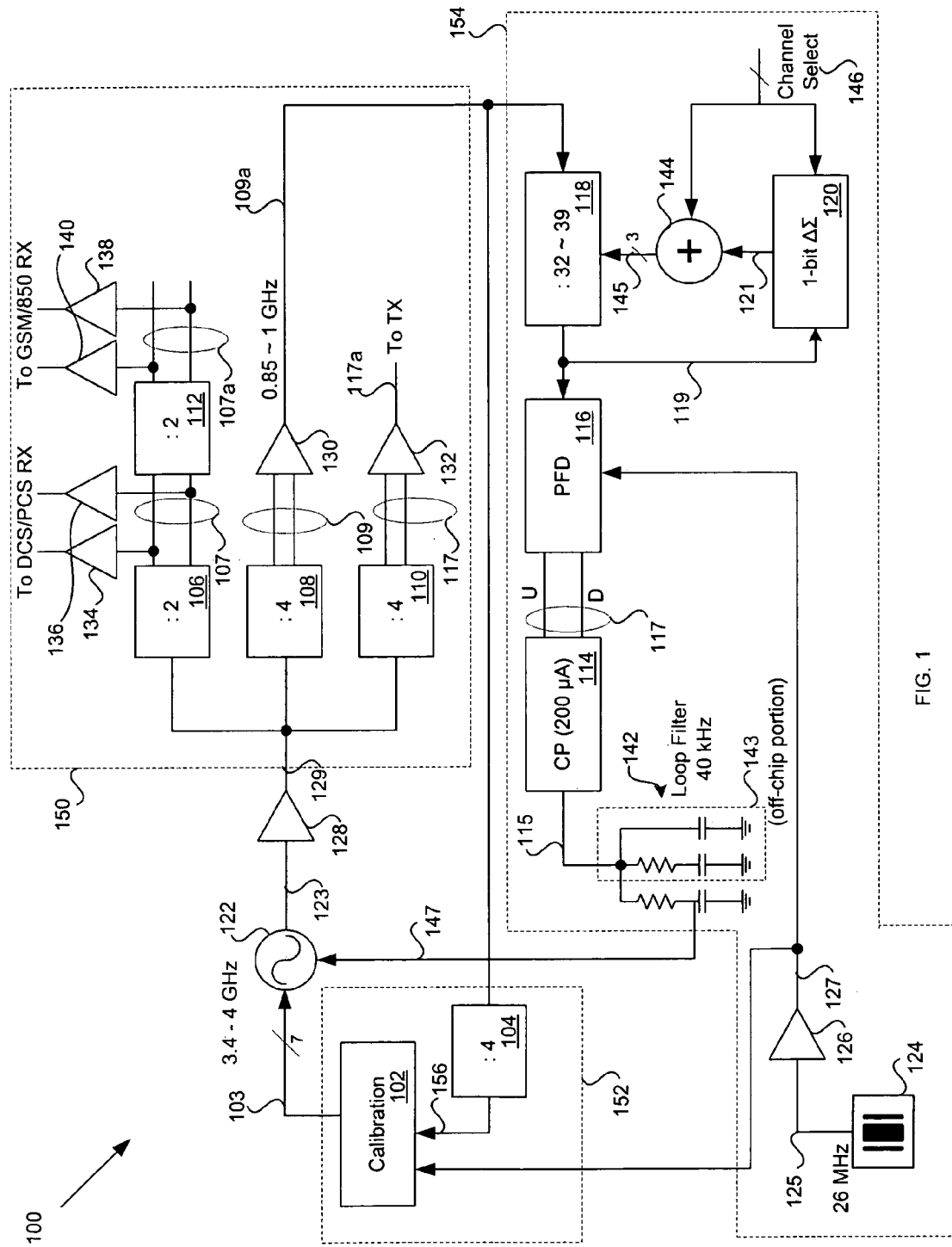
FIG. 1 is a circuit illustrating a synthesizer/local oscillator generator (LOGEN) architecture utilizing fractional-n synthesizer, in accordance with an embodiment of the invention.

FIG. 1 is a circuit illustrating a synthesizer/local oscillator generator (LOGEN) architecture utilizing fractional-n synthesizer, in accordance with an embodiment of the invention. Referring to FIG. 1, the synthesizer/LOGEN architecture 100 may comprise a voltage controlled oscillator (VCO) 122, buffer 128, multiband dividing block 150, coarse calibration circuit 152, and a fine calibration circuit 154.

The multiband dividing block 150 may comprise dividers 106 through 112 and buffers 130 through 140 and may be adapted to receive an oscillator signal 129 from the VCO 122 and generate one or more multiband Rx oscillator signals, such as Rx oscillator signals 107 and 107a, a feedback loop reference signal 109a, and a Tx oscillator signal 117a, for example. The dividers 106 through 112 may comprise suitable circuitry and/or logic and may be adapted to divide an input signal utilizing a determined dividing ratio. The buffers 130 through 140 may comprise suitable circuitry and/or logic and may be adapted to buffer and/or amplify an input signal.

The fine calibration circuit 154 may comprise a multi-modulus divider 118, a delta-sigma modulator 120, a combining block 144, a phase frequency detector 116, a charge pump 114, a loop filter 142, a reference signal oscillator 124, and a buffer 126. The fine calibration circuit 154 may be adapted to receive the feedback loop reference signal 109a, the reference oscillator signal 127, and the channel select signal 146, and utilize these received signals to generate a fine calibration signal 147, for example. The multi-modulus divider 118 may comprise suitable circuitry and/or logic and may be adapted to divide the feedback loop reference signal 109a utilizing a determined dividing ratio. The dividing ratio utilized by the multi-modulus divider 118 may utilize a fractional-n dividing ratio.

The delta-sigma modulator 120 may comprise suitable circuitry and/or logic and may be adapted to receive a channel select signal 146 and a divided signal 119 and modulate the multi-modulus divider 118 so that a dividing ratio corresponding to the channel select signal 146, and a selected frequency channel information, may be determined for use by the multi-modulus divider 118. In one aspect of the invention, the delta-sigma modulator 120 may generate a 1-bit bitstream signal 121, where the 1-bit bitstream 121 may represent an average level of the input signals to the delta-sigma modulator 120. By generating the 1-bit bitstream 121, the 1-bit delta-sigma modulator 120 may be less sensitive to the charge pump 114 and the nonlinearity of the multi-modulus divider 118, when compared to multi-bit delta-sigma modulators.

The 1-bit bitstream 121, as well as the channel select signal 146, may be communicated to the combining block 144. The combining block 144 may comprise suitable circuitry and/or logic and may be adapted to select either the 1-bit bitstream 121 or the channel select signal 146 for communication to the multi-modulus divider 118. After the combining block 144 selects between the 1-bit bitstream 121 and the channel select signal 146, an output signal 145 may be generated and communicated to the multi-modulus divider 118. The multi-modulus divider 118 may then adjust the dividing ratio, divide the feedback loop reference signal 109a, and generate a divided signal 119. The divided signal 119 may then be communicated to the phase frequency detector 116 as well as to the delta-sigma modulator 120 to be utilized as a feedback signal.

The phase frequency detector 116 may comprise suitable circuitry and/or logic and may be adapted to receive a divided signal 119 and a reference signal 127 and generate an output signal 117 based on the phase difference between the divided signal 119 and the reference signal 127. The output signal 117 may comprise an up (U) component and/or a down (D) component, based on whether the divided signal 119 leads or lags the reference signal 127. The charge pump 114 may comprise suitable circuitry and/or logic and may be adapted to receive the output signal 117 and generate positive or negative charge pulses 115 depending on whether the divided signal 119 leads or lags the reference signal 127.

The charge pulses 115 may then be integrated by the loop filter 142 to generate a fine calibration voltage signal 147. In one aspect of the invention, the loop filter may comprise a 40 kHz filter implemented with a plurality of resistance-capacitance (RC) links connected in parallel. For example, the loop filter 142 may comprise two RC links and a capacitor connected in parallel. The sub-section 143 of the loop filter 142, comprising one RC link and a capacitor, may be implemented off-chip, for example, and the remaining RC link may be implemented on-chip.

The crystal reference signal oscillator 124 may be adapted to generate a reference signal 125. The generated reference signal 125 may be buffered by the buffer 126 and the buffered reference signal 127 may then be communicated to the phase frequency detector 116 and/or to the coarse calibration module 102. In an exemplary aspect of the invention, the reference signal oscillator may generate a reference oscillator signal 125 at 26 MHz. The invention, however, may not be limited by the frequency of the oscillator signal 125 and other reference signals may also be utilized by the fine calibration circuit 154 and/or the coarse calibration circuit 152.

The coarse calibration circuit 152 may comprise a divider 104 and a coarse calibration module 102. The coarse calibration circuit 152 may be adapted to receive the feedback loop reference signal 109a and the reference oscillator signal 127 to generate, for example, a 7-bit coarse calibration signal 103. The coarse calibration signal 103 and the fine calibration signal 147 may be utilized by the VCO 122 for coarse and fine calibration of the generated oscillator signal 123 in accordance with the selected channel as determined by the channel select signal 146. The divider 104 may comprise suitable circuitry and/or logic and may be adapted to divide an input signal utilizing a determined dividing ratio. For example, the divider 104 may comprise a divide by four (4) dividing circuit and may be adapted to receive the feedback loop reference signal 109a and generate a divided signal 156. Although a 7-bit coarse calibration is utilized, the invention is not so limited. Coarse calibration utilizing a different number of bits may also be utilized.

The coarse calibration module 102 may comprise suitable circuitry and/or logic and may be adapted to receive the reference signal 127 and the divided signal 156 to generate a coarse calibration signal 103. In one aspect of the invention, the coarse calibration module 102 may utilize 7-bit coarse calibration signal generation techniques. For example, a 7-bit coarse calibration signal 103 may be selected from 128 different frequencies. The coarse calibration module 102 may be adapted to select a calibration signal that is close to one of the 128 reference frequencies. By utilizing 7-bit coarse calibration techniques, the coarse calibration module 102 may be adapted to quickly generate the coarse calibration signal 103. The coarse calibration signal 103 may then be communicated to the VCO 122 for coarse calibration followed by a fine calibration utilizing the fine calibration signal 147.

In operation, the VCO 122 may generate an oscillator signal 123. The oscillator signal 123 may be generated within a determined range, such as between about 3.4 GHz and 4 GHz, in accordance with a channel select signal 146. The channel select signal 146 may be a user-generated signal and may correspond to a selected channel associated with a frequency band, such as DCS, PCS, and/or GSM, for example. After the VCO 122 generates the oscillator signal 123, the oscillator signal 123 may be buffered by the buffer 128. The buffered oscillator signal 129 may then be communicated to the multiband dividing block 150 for further processing.

In one aspect of the invention, the multiband dividing block 150 may utilize divide by two (2) dividing circuits 106 and 112 to divide the oscillator signal 129 and generate multiband Rx oscillator signals 107 and 107a. For example, the divide by two (2) dividing circuit 106 may divide the oscillator signal 129 to generate the in-phase (I) and quadrature (Q) components of the multiband Rx oscillator signal 107. The in-phase (I) and quadrature (Q) components of the multiband Rx oscillator signal 107 may then be buffered by the buffers 134 and 136, respectively. The multiband Rx oscillator signal 107 may be between about 1.7 GHz and 1.9 GHz, for example, for Rx oscillator signal coverage in the DCS and PCS bands.

The multiband Rx oscillator signal 107 may then be further divided by the divide by two (2) dividing circuit 112 to generate the in-phase (I) and quadrature (Q) components of the multiband Rx oscillator signal 107a. The in-phase (I) and quadrature (Q) components of the multiband Rx oscillator signal 107a may then be buffered by the buffers 140 and 138, respectively. The multiband Rx oscillator signal 107a may be between about 850 MHz and 900 MHz, for example, for Rx oscillator signal coverage in the GSM band and the 850 MHz band.

In another aspect of the invention, the oscillator signal 129 may be utilized by the multiband dividing block 150 to generate the feedback loop reference signal 109a. For example, the oscillator signal 129 may be divided by the divide by four (4) dividing circuit 108 to generate the in-phase (i) and quadrature (Q) components of the feedback loop reference signal 109. The generated feedback reference signal 109 may then be buffered by the buffer 130 and the buffered feedback loop reference signal 109a may be communicated to the fine calibration circuit 154 and/or the coarse calibration circuit 152. The feedback loop reference signal 109a may be between about 850 MHz and 1 GHz, for example, and may be utilized for the generation of the coarse calibration and fine calibration signals 103 and 147, respectively. The present invention may not be limited by the frequency range of the VCO generated oscillator signal 123 and the feedback loop reference signal 109a. Therefore, frequency ranges other than a VCO generated oscillator frequency range of about 3.4 GHz to 4 GHz may also be utilized within the synthesizer/LOGEN architecture 100.

The oscillator signal 129 may also be utilized by the multiband dividing block 150 to generate the Tx oscillator signal 117a. For example, the oscillator signal 129 may be divided by the divide by four (4) dividing circuit 110 to generate the in-phase (I) and quadrature (Q) components of the Tx oscillator signal 117. The Tx oscillator signal 117 may then be buffered by the buffer 132 and the buffered Tx oscillator signal 117a may be communicated to a transmitter block, for example, for further processing.

After the feedback loop reference signal is generated by the multiband dividing block 150, the feedback loop reference signal may be communicated to the fine calibration circuit 154 and the coarse calibration circuit 152. In one aspect of the invention, the fine calibration circuit 154 may comprise a fractional-n synthesizer adapted to generate the fine calibration signal 147. The multi-modulus divider 118 may receive and divide the feedback loop reference signal 109a utilizing a determined dividing ratio. The dividing ratio utilized by the multi-modulus divider 118 may comprise a fractional-n dividing ratio. For example, if the feedback loop reference signal is between about 850 MHz and 1 GHz, the multi-modulus divider 118 may utilize a fractional dividing ratio of about 32.0 to 39.0. In this manner, the divided signal 119 may be about 25–26 MHz, which signal may then be compared with the reference oscillator signal 127 in the phase frequency detector 116.

The delta-sigma modulator 120 may receive a channel select signal 146 and a divided signal 119 and modulate the multi-modulus divider 118 so that a dividing ratio corresponding to the channel select signal 146, and a selected frequency channel information, may be determined for use by the multi-modulus divider 118. The delta-sigma modulator 120 may be adapted to generate, for example, a 1-bit bitstream signal 121, for example, where the 1-bit bitstream 121 may represent an average level of the input signals to the delta-sigma modulator 120.

The 1-bit bitstream 121, as well as the channel select signal 146, may be communicated to the combining block 144. The combining block 144 may select either the 1-bit bitstream 121 or the channel select signal 146 for communication to the multi-modulus divider 118. After the combining block 144 selects between the 1-bit bitstream 121 and the channel select signal 146, an output signal 145 may be generated and communicated to the multi-modulus divider 118. The multi-modulus divider 118 may then adjust the dividing ratio, divide the feedback loop reference signal 109a, and generate a divided signal 119. The divided signal 119 may then be communicated to the phase frequency detector 116 as well as to the delta-sigma modulator 120.

The phase frequency detector 116 may receive the divided signal 119 and a reference signal 127 from the reference oscillator 124, and generate an output signal 117 based on the phase difference between the divided signal 119 and the reference signal 127. The output signal 117 may comprise an up (U) component and/or a down (D) component, based on whether the divided signal 119 leads or lags the reference signal 127. The charge pump 114 may be adapted to receive the output signal 117 and generate positive or negative charge pulses 115 depending on whether the divided signal 119 leads or lags the reference signal 127. The charge pulses 115 may then be integrated by the loop filter 142 to generate a fine calibration signal 147. After the fine calibration signal 147 is generated by the loop filter 142, the fine calibration signal 147 may be communicated to the VCO 122 for fine calibration.

After the feedback loop reference signal 109a is generated by the multiband dividing block 150, the feedback loop reference signal 109a may also be communicated to the coarse calibration circuit 152 for further processing. The coarse calibration circuit 152 may be adapted to receive the feedback loop reference signal 109a and the reference oscillator signal 127 to generate a 7-bit coarse calibration signal 103. The coarse calibration signal 103 and the fine calibration signal 147 may be utilized by the VCO 122 for coarse and fine calibration of the generated oscillator signal 123 in accordance with the selected channel as determined by the channel select signal 146.

The feedback loop reference signal 109a may be initially communicated to the divider 104. The divider 104 may divide the feedback loop reference signal 109a and generate a divided signal 156. The coarse calibration module 102 may receive the reference signal 127 and the divided signal 156 to generate a coarse calibration signal 103. In one aspect of the invention, the coarse calibration module 102 may utilize 7-bit coarse calibration signal generation techniques. For example, a 7-bit coarse calibration signal 103 may be selected from 128 different frequencies. The coarse calibration module 102 may be adapted to select a calibration signal that is close to one of the 128 reference frequencies. The coarse calibration signal 103 may then be communicated to the VCO 122 for coarse calibration followed by a fine calibration utilizing the fine calibration signal 147.

In one aspect of the invention, buffers 128 through 140 within the synthesizer/LOGEN architecture 100 may be implemented as high frequency buffers. In addition, buffers 128 through 140 may utilize PMOS and/or NMOS transistors as transconductors with a common mode bias from a DC current source within the buffers. In this manner, parasitic capacitance with buffers 128 through 140, as well as within the synthesizer/LOGEN architecture 100, may be reduced.

Figure 2:
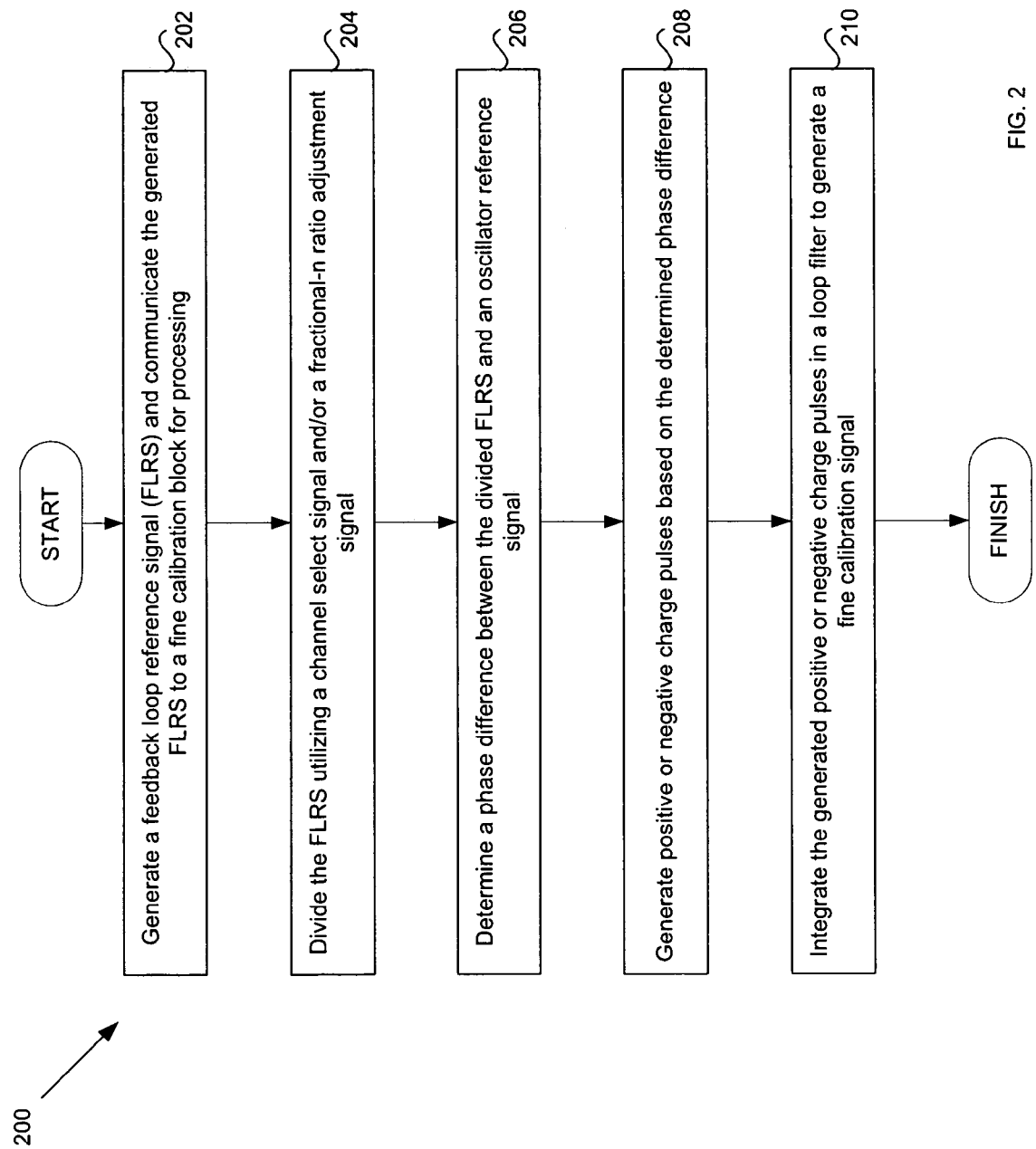
FIG. 2 is a flow diagram of an exemplary method for generating a fine calibration signal, in accordance with an embodiment of the invention.

FIG. 2 is a flow diagram of an exemplary method 200 for generating a fine calibration signal, in accordance with an embodiment of the invention. Referring to FIG. 2, at 202, a feedback loop reference signal may be generated and communicated to a fine calibration block for processing. At 204, the feedback loop reference signal may be divided by a fractional-n divider. The fractional-n divider may utilize a channel select input signal and/or a fractional-n dividing ratio adjustment signal to divide the feedback loop reference signal. At 206, a phase difference may be determined between the divided feedback loop reference signal and an oscillator reference signal. At 208, positive or negative charges may be generated based on the determined phase difference between the divided feedback loop reference signal and an oscillator reference signal. For example, positive or negative charges may be generated by a charge pump. At 210, the generated positive or negative charges may be integrated in a loop filter to generate a fine calibration signal.

Figure 3:
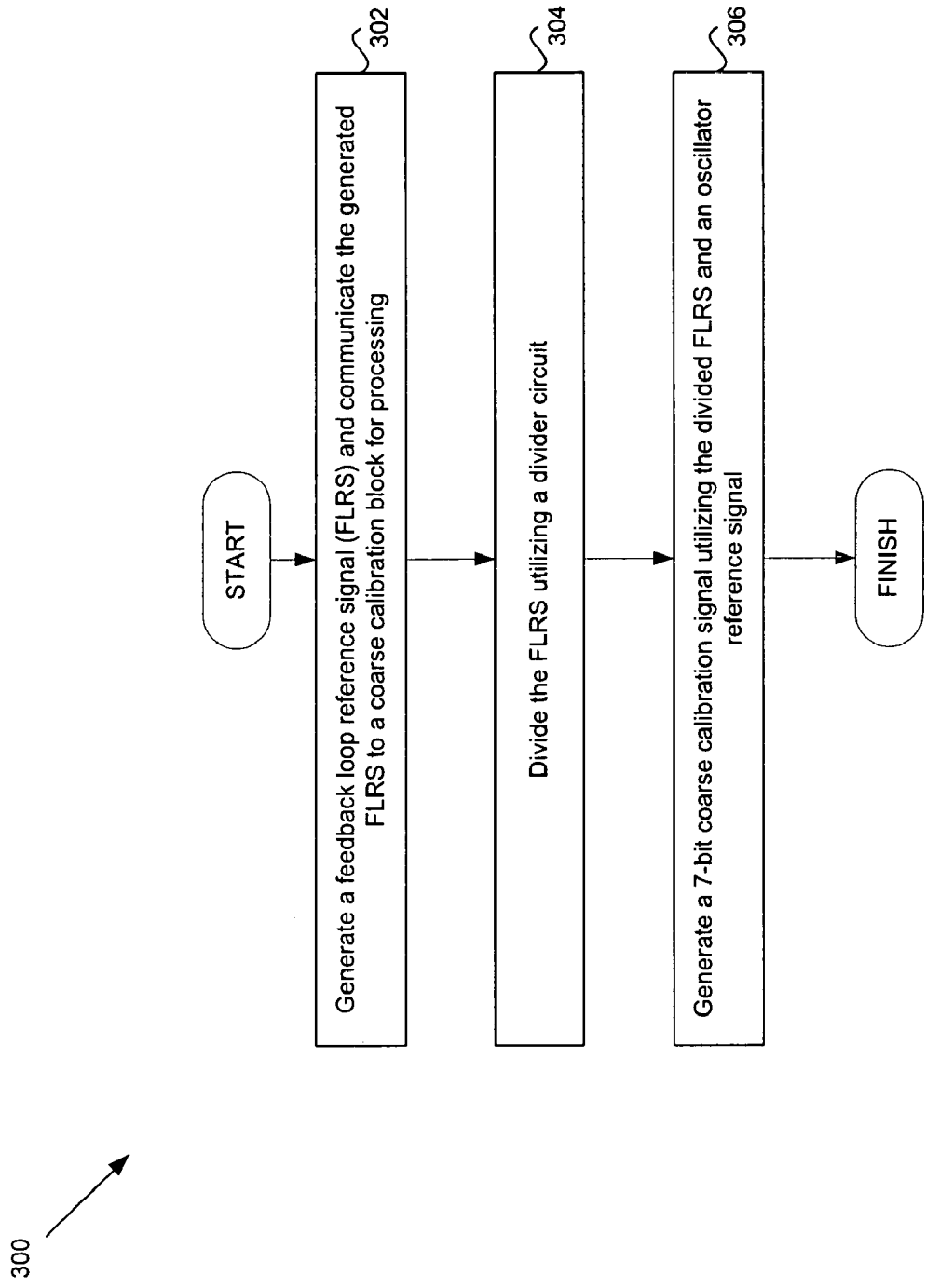
FIG. 3 is a flow diagram of an exemplary method for generating a coarse calibration signal, in accordance with an embodiment of the invention.

FIG. 3 is a flow diagram of an exemplary method 300 for generating a coarse calibration signal, in accordance with an embodiment of the invention. Referring to FIG. 3, at 302, a feedback loop reference signal may be generated and communicated to a coarse calibration block for processing. At 304, the generated feedback loop reference signal may be divided utilizing a divider circuit. At 306, a 7-bit coarse calibration signal utilizing the divided feedback loop reference signal and an oscillator reference signal.

Figure 4:
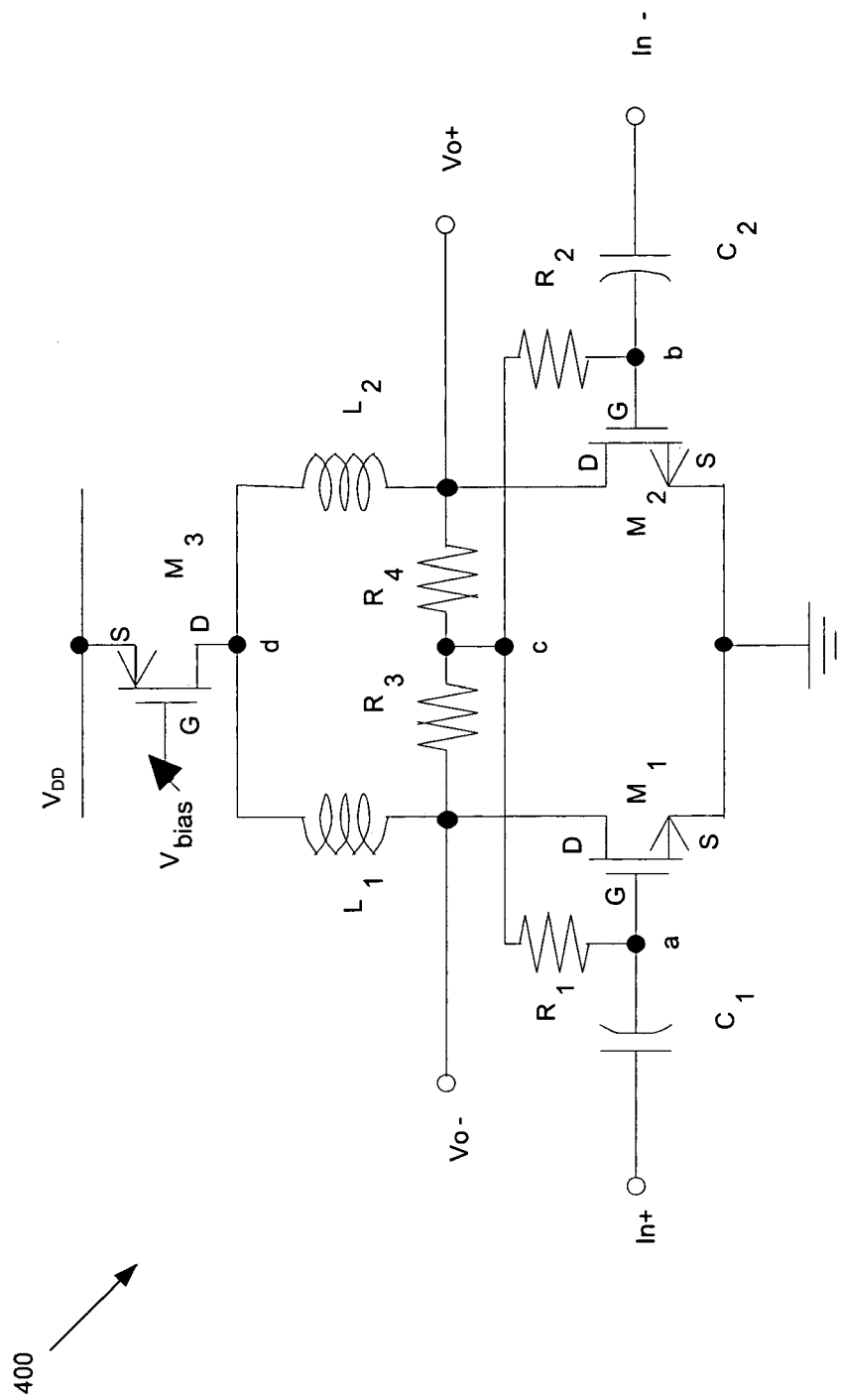
FIG. 4 is a circuit illustrating a buffer with PMOS current bias that may be utilized in accordance with an embodiment of the invention.

FIG. 4 is a circuit illustrating a buffer 400 with PMOS current bias that may be utilized in accordance with an embodiment of the invention. Referring to FIG. 4, the buffer 400 may comprise transistors M1 through M3, resistors R1 through R4, inductors L1 and L2, and capacitors C1 and C2. The buffer 400 may also comprise differential inputs In+ and In− and corresponding differential outputs Vo− and Vo+.

In one aspect of the invention, transistor M3 may comprise a PMOS transistor and transistors M2 and M1 may comprise NMOS transistors. Transistor M3 may be implemented as a DC current source by connecting the source of M3 to a DC voltage source $V_{DD}$. The DC current source transistor may be turned on and off by changing the gate voltage $V_{bias}$. The drain of M3 may be coupled to node "d" of the buffer 400 so that DC current may flow down to transistors M1 and M2.

Transistors M1 and M2 may be implemented as transconductors utilizing NMOS transistors, for example. The gates of transistors M1 and M2 may be AC coupled by the capacitors C1 and C2, respectively. By utilizing capacitors C1 and C2 after the differential inputs In+ and In−, direct current may not be conducted to the gates of transistors M1 and M2 and only AC signal may be allowed to pass through capacitors C1 and C2. In this matter, AC signal from the inputs In+ and In− may pass through C1 and C2 and be preserved at nodes "a" and "b." The sources of transistors M1 and M2 may be connected to ground and the drains of transistors M1 and M2 may be connected to inductors L1 and L2 respectively.

Inductors L1 and L2 may be utilized to allow any direct current coming from the DC current source transistor M3 and block any alternating current coming from the drains of transistors M1 and M2. Resistors R1 and R2 may be utilized to isolate the differential inputs in + and In−, and resistors R3 and R4 may be utilized to isolate the differential outputs Vo− and Vo+. Resistors R1 and R2 may be utilized to isolate nodes "a," "b," and "c" from each other so that AC signals passing through capacitors C1 and C2 may not be lost to node "c" but may instead be preserved at nodes "a" and "b" to generate the maximum AC current possible by M1 and M2.

Since transistors M1 and M2 may be implemented as transconductors, or voltage-to-current generators, as AC charge accumulates at the gates of transistors M1 and M2, corresponding transistor current may also change proportionately. In order for transistors M1 and M2 to operate as transconductors, M1 and M2 may need to operate in their saturation region. The DC current source transistor M3 may also need to be saturated in order to operate as a current source. In this manner, transistors M1, M2, and M3 may be turned ON within the buffer 400 by adjusting their respective gate-source voltages $V_{GS}$ to be greater than a threshold voltage $V_{THR}$, or $V_{GS}>V_{THR}$. After transistors M1, M2, and M3 are turned ON by adjusting their gate-source voltages $V_{GS}$ to be greater than a threshold voltage $V_{THR}$, transistors M1 through M3 may operate saturated by adjusting their drain to source voltages $V_{DS}$ to be greater than a saturation voltage $V_{DSAT}$.

In an exemplary aspect of the invention, transistors M1 and M2 may be biased utilizing common mode feedback by averaging the outputs Vo− and Vo+ via a mid-point between resistors R3 and R4, for example. Since the outputs Vo− and Vo+ of buffer 400 are differential, AC signals at the outputs Vo− and Vo+ may cancel each other out at node "c." Accordingly, a DC average signal may remain at node "c" and may be utilized for common mode feedback through resistors R1 and R2 to the gates of transistors M1 and M2, respectively. In this manner, AC signal from the differential inputs In+ and In− may pass through capacitors C1 and C2 and may be combined at nodes "a" and "b" with the DC biasing voltage from node "c."

In operation, DC current from the differential inputs of buffer 400 may be blocked by capacitors C1 and C2, and AC current may pass through and accumulate at nodes "a" and "b" resulting in and AC voltage that "rides on top of" DC bias voltage from node "c." As the input AC current passing through capacitors C1 and C2 changes, the gate-to-source voltage $V_{GS}$ of transistors M1 and M2 may also change accordingly. As a result of changes in $V_{GS}$, AC current may be generated by transistors M1 and M2. Inductors L1 and L2 may be adapted to respond to the AC current generated by transistors M1 and M2 with a sufficiently large impedance, thus blocking any AC current from reaching the DC current at node "d." As a result of the AC current generated by transistors M1 and M2 and the corresponding impedance of L1 and L2, output AC voltages may be generated and communicated outside the buffer 400 via differential outputs Vo− and Vo+.

In a different aspect of the invention, parasitic capacitance and resulting load on buffer 400 may be reduced by eliminating resistors R3 and R4. The common mode DC biasing for transistors M1 and M2 may then be utilized from node "d" of the DC current source transistor M3. By eliminating R3 and R4, the buffer 400 may be implemented utilizing smaller area in silicon.

Figure 5:
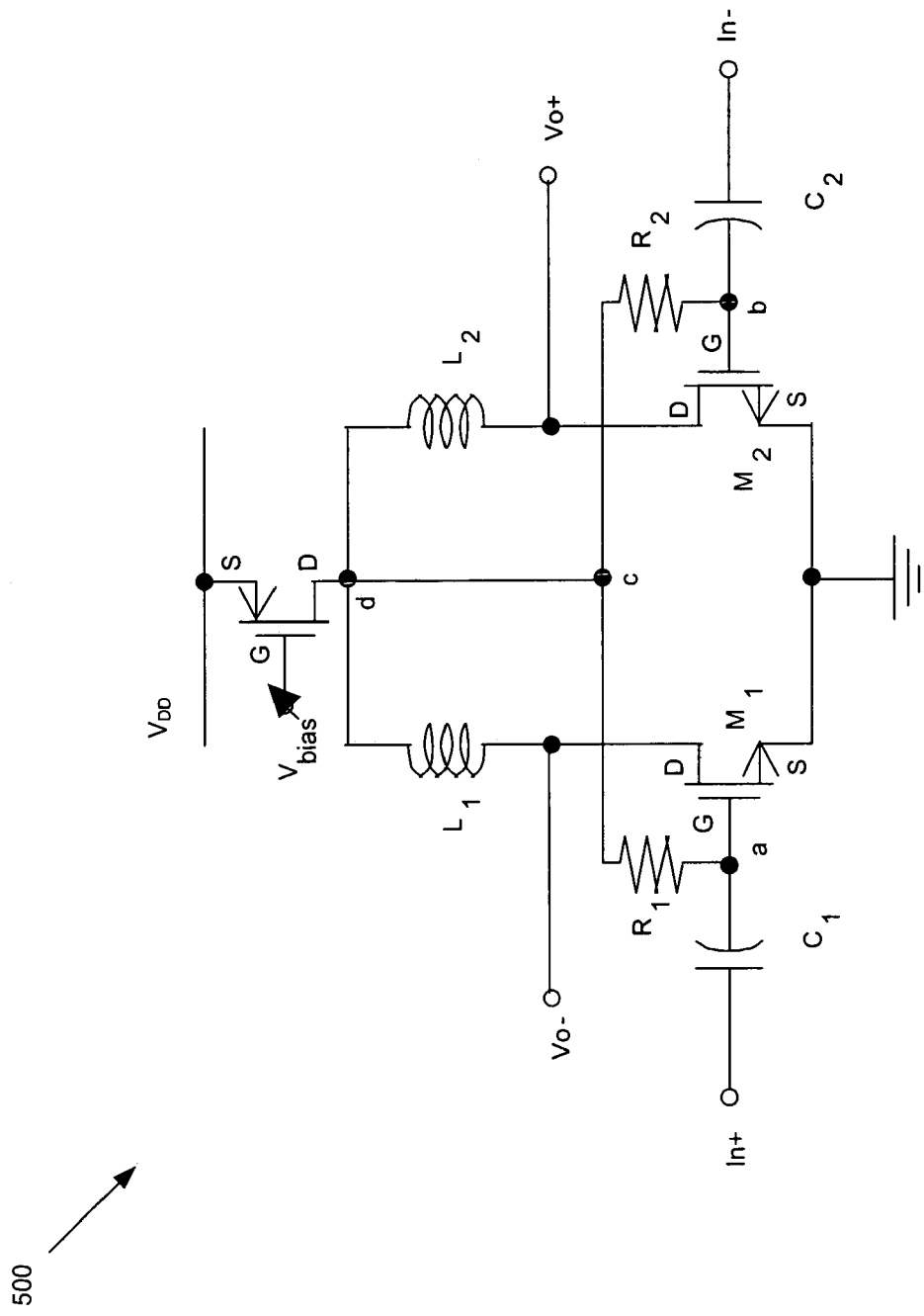
FIG. 5 is a circuit illustrating a buffer with a PMOS current source and common mode bias, in accordance with an embodiment of the invention.

FIG. 5 is a circuit illustrating a buffer 500 with a PMOS current source and common mode bias, in accordance with an embodiment of the invention. Referring to FIG. 5, the buffer 500 may comprise transistors M1 through M3, resistors R1 and R2, inductors L1 and L2, and capacitors C1 and C2. The buffer 500 may also comprise differential inputs In+ and In− and corresponding differential outputs Vo− and Vo+.

In one aspect of the invention, transistor M3 may comprise a PMOS transistor and transistors M2 and M1 may comprise NMOS transistors. Transistor M3 may be implemented as a DC current source by connecting the source of M3 to a DC voltage source $V_{DD}$. The DC current source transistor may be turned on and off by changing the gate voltage $V_{bias}$. The drain of M3 may be coupled to node "d" of the buffer 500 so that DC current may flow down to transistors M1 and M2.

Transistors M1 and M2 may be implemented as transconductors utilizing NMOS transistors, for example. The gates of transistors M1 and M2 may be AC coupled by the capacitors C1 and C2, respectively. By utilizing capacitors C1 and C2 after the differential inputs In+ and In−, direct current (DC) may not be conducted to the gates of transistors M1 and M2 and only alternating current (AC) may be allowed to pass through capacitors C1 and C2. In this manner, AC signal from the inputs In+ and In− may pass through capacitors C1 and C2 and arrive at the gates of transistors M1 and M2. The sources of transistors M1 and M2 may be connected to ground and the drains of transistors M1 and M2 may be connected to inductors L1 and L2 respectively.

Inductors L1 and L2 may be utilized to allow any direct current coming from the DC current source transistor M3 and block any alternating current coming from the drains of transistors M1 and M2. Resistors R1 and R2 may be utilized to isolate the differential inputs In+ and In−, for example. Resistors R1 and R2 may also be utilized to isolate nodes "a," "b," and "c" from each other so that AC signals passing through capacitors C1 and C2 may not reach node "c" and may instead accumulate at nodes "a" and "b" to build the required AC charge necessary for the AC current generation by M1 and M2.

Since transistors M1 and M2 may be implemented as transconductors, or voltage-to-current generators, as AC charge accumulates at the gates of transistors M1 and M2, corresponding transistor current may also change proportionately. In order for transistors M1 and M2 to operate as transconductors, M1 and M2 may need to operate in their saturation region. The DC current source transistor M3 may also need to be saturated in order to operate as a current source. In this manner, transistors M1, M2, and M3 may be turned ON within the buffer 500 by adjusting their respective gate-source voltages $V_{GS}$ to be greater than a threshold voltage $V_{THR}$, or $V_{GS}>V_{THR}$. After transistors M1, M2, and M3 are turned ON by adjusting their gate-source voltages $V_{GS}$ to be greater than a threshold voltage $V_{THR}$, transistors M1 through M3 may operate in saturation by adjusting their drain to source voltages $V_{DS}$ to be greater than their respective saturation voltages $V_{DSAT}$.

In an exemplary aspect of the invention, transistors M1 and M2 may be biased utilizing common mode feedback by averaging the outputs Vo− and Vo+ via a mid-point between the inductors L1 and L2, at node "d." Since the outputs Vo− and Vo+ of buffer 500 are differential, AC signals at the outputs Vo− and Vo+ may be blocked by the impedance of inductors L1 and L2, thus not reaching node "d." As inductors L1 and L2 may conduct the DC current from the differential outputs Vo− and Vo+, DC common mode bias may be acquired from node "d" and communicated through node "c" to nodes "a" and "b" of transistors M1 and M2. Accordingly, a DC average signal may remain at node "d" and may be utilized for common mode feedback through resistors R1 and R2 to the gates of transistors M1 and M2, respectively. In this manner, AC signal from the differential inputs In+ and In− may pass through capacitors C1 and C2 and may be combined at nodes "a" and "b" with the DC biasing voltage from node "c." By utilizing common mode DC bias from node "d" and eliminating a common mode resistor pair coupled to differential outputs Vo− and Vo+, as illustrated in FIG. 4, parasitic capacitance and loading of buffer 500 may be reduced.

In operation, DC current from the differential inputs of buffer 500 may be blocked by capacitors C1 and C2, and AC signal from the differential inputs In+ and In− may pass through capacitors C1 and C2 and may be combined at nodes "a" and "b" with the DC biasing voltage from node "c." As the input AC current passing through capacitors C1 and C2 changes, the gate-to-source voltage $V_{GS}$ of transistors M1 and M2 may also change accordingly. As a result of changes in $V_{GS}$, AC current may be generated by transistors M1 and M2. Inductors L1 and L2 may be adapted to respond to the AC current generated by transistors M1 and M2 with a sufficiently large impedance, thus blocking any AC current from reaching the DC current at node "d." As a result of the AC current generated by transistors M1 and M2 and the corresponding impedance of L1 and L2, output AC voltages may be generated and communicated outside the buffer 500 via differential outputs Vo− and Vo+.

Even though aspects of the present invention may utilize a PMOS transistor as a DC current source and NMOS transistors as differential buffer input transconductors, the invention may not be so limited. Accordingly, an NMOS transistor may be utilized as a DC current source and PMOS transistors may be utilized as differential buffer input transconductors.

Figure 6:
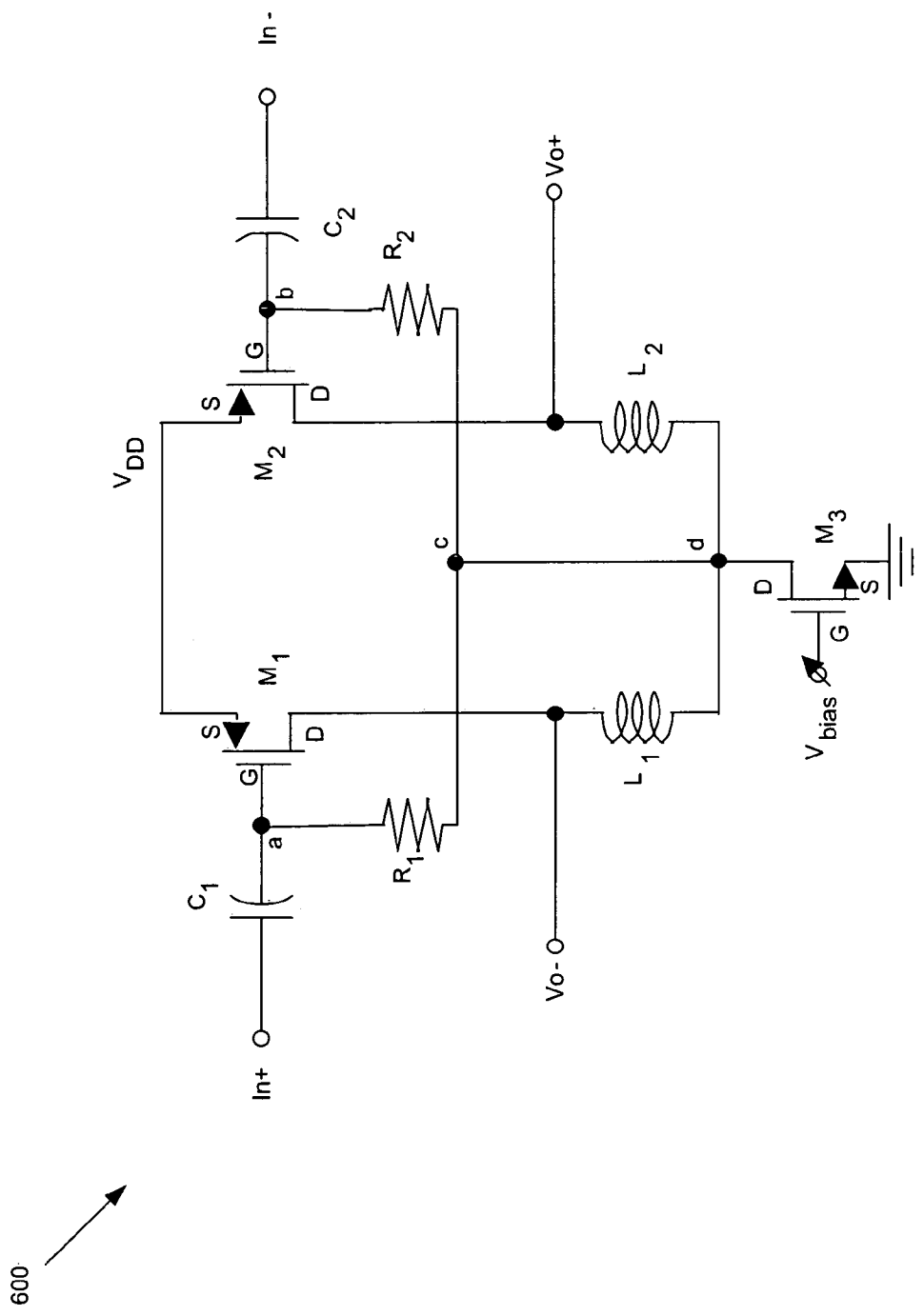
FIG. 6 is a circuit illustrating a buffer with an NMOS current source and common mode bias, in accordance with an embodiment of the invention.

FIG. 6 is a circuit illustrating a buffer 600 with an NMOS current source and common mode bias, in accordance with an embodiment of the invention. Referring to FIG. 6, the buffer 600 may comprise transistors M1 through M3, resistors R1 and R2, inductors L1 and L2, and capacitors C1 and C2. The buffer 600 may also comprise differential inputs In+ and In− and corresponding differential outputs Vo− and Vo+.

In one aspect of the invention, transistor M3 may comprise an NMOS transistor and transistors M2 and M1 may comprise PMOS transistors. Transistor M3 may be implemented as a DC current source by connecting the source of M3 to ground and the drain to node "d," which may be connected to a DC voltage source $V_{DD}$ via the sources of transistors M1 and M2. The DC current source transistor may be turned on and off by changing the gate voltage $V_{bias}$.

The drain of M3 may be coupled to node "d" of the buffer 500 so that DC current may flow to transistors M1 and M2.

Transistors M1 and M2 may be implemented as transconductors utilizing PMOS transistors, for example. The gates of transistors M1 and M2 may be AC coupled by the capacitors C1 and C2, respectively. By utilizing capacitors C1 and C2 after the differential inputs In+ and In−, direct current (DC) may not be conducted to the gates of transistors M1 and M2 and only alternating current (AC) may be allowed to pass through capacitors C1 and C2. In this manner, AC charge from the inputs In+ and In− may induce charge on the opposite sides of capacitors C1 and C2 that accumulates at the gates of transistors M1 and M2. The sources of transistors M1 and M2 may be connected to the DC voltage source $V_{DD}$.

Inductors L1 and L2 may be utilized to allow any direct current (DC) coming from the DC current source transistor M3 and block any alternating current coming from the drains of transistors M1 and M2. Resistors R1 and R2 may be utilized to isolate the differential inputs In+ and In−, for example. Resistors R1 and R2 may also be utilized to isolate nodes "a," "b," and "c" from each other so that AC signals passing through capacitors C1 and C2 may not reach node "c." Accordingly, the AC signals may induce charge on the opposite sides of capacitors C1 and C2 and may accumulate at nodes "a" and "b" to build the required AC charge necessary for the AC current generation by M1 and M2.

Since transistors M1 and M2 may be implemented as transconductors, or voltage-to-current converters as AC charge accumulates at the gates of transistors M1 and M2, corresponding transistor current may also change proportionately. In order for transistors M1 and M2 to operate as transconductors, M1 and M2 may need to operate in their saturation region. The DC current source transistor M3 may also need to be saturated in order to operate as a current source. In this manner, transistors M1, M2, and M3 may be turned ON within the buffer 600 by adjusting their respective gate-source voltages $V_{GS}$ to be greater than a threshold voltage $V_{THR}$, or $V_{GS} > V_{THR}$. After transistors M1, M2, and M3 are turned ON by adjusting their gate-source voltages $V_{GS}$ to be greater than a threshold voltage $V_{THR}$, transistors M1 through M3 may operate saturated by adjusting their drain to source voltages $V_{DS}$ to be greater than their respective saturation voltages $V_{DSAT}$.

In an exemplary aspect of the invention, transistors M1 and M2 may be biased utilizing common mode feedback by averaging the outputs Vo− and Vo+ via a mid-point between the inductors L1 and L2, at node "d." Since the outputs Vo− and Vo+ of buffer 600 are differential, AC signals at the outputs Vo− and Vo+ may cancel out at node "d." Furthermore, the impedance of inductors L1 and L2 may resist the transfer of odd order harmonics, which may not cancel out in a differential system, to node "d." This As inductors L1 and L2 may conduct the DC current from the differential outputs Vo− and Vo+, DC common mode bias may be acquired from node "d" and communicated through node "c" to nodes "a" and "b" of transistors M1 and M2. Accordingly, a DC average signal may remain at node "d" and may be utilized for common mode feedback through resistors R1 and R2 to the gates of transistors M1 and M2, respectively. AC signal from the differential inputs In+ and In− may pass through capacitors C1 and C2 and may be combined at nodes "a" and "b" with the DC biasing voltage from node "c." By utilizing common mode DC bias from node "d" and eliminating a common mode resistor pair coupled to differential outputs Vo− and Vo+, as illustrated in FIG. 4, parasitic capacitance and loading of buffer 600 may be reduced.

In operation, DC current from the differential inputs of buffer 600 may be blocked by capacitors C1 and C2. AC signal from the differential inputs In+ and In− may pass through capacitors C1 and C2 and may be combined at nodes "a" and "b" with the DC biasing voltage from node "c." As the input AC signal passing through capacitors C1 and C2 changes, the gate-to-source voltage $V_{GS}$ of transistors M1 and M2 may also change accordingly. As a result of changes in $V_{GS}$, AC current may be generated by transistors M1 and M2. Inductors L1 and L2 may be adapted to respond to the AC current generated by transistors M1 and M2 with a sufficiently large impedance, thus blocking any AC current from reaching the DC current at node "d." As a result of the AC current generated by transistors M1 and M2 and the corresponding impedance of L1 and L2, output AC voltages may be generated and communicated outside the buffer 600 via differential outputs Vo− and Vo+.

In an exemplary aspect of the invention, a high frequency inductively loaded buffer may utilize a differential inductor and complementary NMOS and PMOS input transconductors to generate a high output voltage swing and high output gain. Differential input signals may be coupled to both the NMOS and PMOS transistor pairs. The high output voltage swing and higher output gain may be achieved by utilizing one pair of transistors which are configured as input transconductors that may be self-biased from a center tap of the differential inductor, and by utilizing the second pair of transistors both as a DC current source as well as input transconductors.

Figure 7:
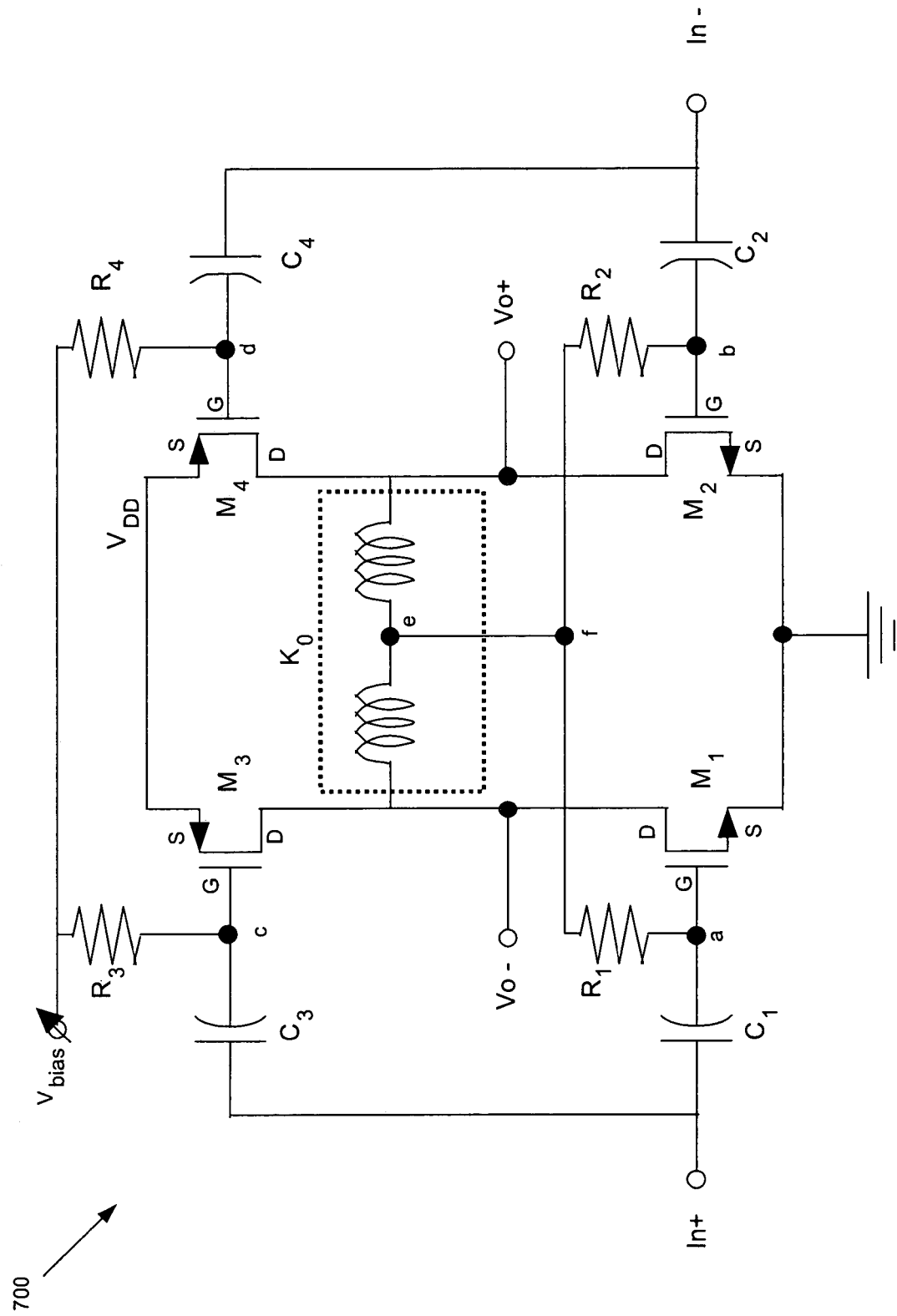
FIG. 7 is a circuit illustrating a buffer with complementary transconductors and common mode biased NMOS transistor pair, in accordance with an embodiment of the invention.

FIG. 7 is a circuit illustrating a buffer with complementary transconductors and common mode biased NMOS transistor pair, in accordance with an embodiment of the invention. Referring to FIG. 7, the buffer 700 may comprise transistors M1 through M4, resistors R1 through R4, load inductor K0, and capacitors C1 through C4. The buffer 700 may also comprise differential inputs In+ and In− and corresponding differential outputs Vo− and Vo+.

In one embodiment of the invention, the transistors M1 and M2 may be configured as input transconductors utilizing NMOS transistors, for example. The gates of transistors M1 and M2 may be AC coupled by the capacitors C1 and C2, respectively. By utilizing capacitors C1 and C2 after the differential inputs In+ and In−, direct current (DC) is not conducted to the gates of transistors M1 and M2 and only alternating current (AC) may be allowed to flow through capacitors C1 and C2. In this manner, AC current from the inputs In+ and In− may flow through capacitors C1 and C2 and conducted to the gates of transistors M1 and M2. The sources of transistors M1 and M2 may be coupled to ground and the drains of transistors M1 and M2 may be coupled to the drains of transistors M3 and M4, respectively.

In one aspect of the invention, transistors M3 and M4 may comprise PMOS transistors and transistors M1 and M2 may comprise NMOS transistors. Further, transistors M3 and M4 may also be implemented as input transconductors and as a DC current source by coupling the sources of M3 and M4 to a DC voltage source $V_{DD}$. The DC current source transistors M3 and M4 may be coupled to a bias gate voltage source $V_{bias}$ via resistors R3 and R4, respectively, and may be turned ON and OFF by changing the gate voltage $V_{bias}$.

Transistors M3 and M4 may be implemented as transconductors by AC coupling the gates of M3 and M4 by the capacitors C3 and C4, respectively, where the capacitors C3 and C4 may be coupled to the differential input signals In+ and In−. By utilizing capacitors C3 and C4 after the differential inputs In+ and In−, direct current (DC) may not be conducted to the gates of transistors M3 and M4 and only alternating current (AC) may be allowed to pass through capacitors C3 and C4. In this manner, AC current from the inputs In+ and In− may flow through capacitors C3 and C4 and conducted to the gates of transistors M3 and M4. The drains of transistors M3 and M4 may be coupled to the output nodes of the load inductor K0, as well as to the drains of transistors M1 and M2, so that DC current may flow down from M3 and M4 to the load inductor K0 and transistors M1 and M2. The resistors R3 and R4 may also be utilized to isolate nodes "c" and "d" from each other so that AC signals flow through capacitors C3 and C3 may accumulate at nodes "c" and "d" to generate an AC charge that may be utilized by M3 and M4 to generate and AC current.

The load inductor K0 may be utilized to provide high impedance at the operating frequency of the buffer 700. In this regard, the load inductor K0 may allow any direct current flowing from the DC current source transistors M3 and M4 and block any alternating current coming from the drains of transistors M3 and M4 and/or the drains of transistors M1 and M2, thus generating the output voltage Vo− and Vo+. Further, the load inductor K0 may be center-tapped for a common mode bias for the transistors M1 and M2 via the resistors R1 and R2.

Resistors R1 and R2 may be utilized to isolate the differential inputs In+ and In−, for example. Resistors R1 and R2 may also be utilized to isolate nodes "a," "b," and "f" from each other so that AC signals passing through capacitors C1 and C2 may not reach node "f" and may instead accumulate at nodes "a" and "b" to build the required AC charge necessary for the AC current generation by M1 and M2.

Since the transistors M1 through M4 may be implemented as input transconductors, or voltage-to-current generators, as AC charge accumulates at the gates of transistors M1 through M4, corresponding transistor currents may also change proportionately. In order for transistors M1 through M4 to operate as transconductors, M1 through M4 may need to operate in saturation. In this regard, transistors M1 through M4 may be turned ON within the buffer 700 by adjusting their respective gate-source voltages $V_{GS}$ to be greater than a threshold voltage $V_{THR}$, or $V_{GS} > V_{THR}$. After transistors M1 through M4 are turned ON by adjusting their gate-source voltages $V_{GS}$ to be greater than a threshold voltage $V_{THR}$, transistors M1 through M4 may operate in saturation by adjusting their drain to source voltages $V_{DS}$ to be greater than their respective saturation voltages $V_{DSAT}$.

In an exemplary aspect of the invention, transistors M1 and M2 may be biased utilizing common mode feedback from a center tap node "e" of the load inductor K0. Since AC current may be blocked by the impedance of the load inductor K0, only DC current may reach node "e." DC common mode bias may, therefore, be acquired from node "e" and communicated through node "f" to nodes "a" and "b" of transistors M1 and M2. Accordingly, a DC average signal may remain at node "f" and may be utilized for common mode feedback through resistors R1 and R2 to the gates of transistors M1 and M2, respectively. In this regard, AC signal from the differential inputs In+ and In− may pass through capacitors C1 and C2 and may be combined at nodes "a" and "b" with the DC biasing voltage from node "f."

In operation, DC voltage from the differential inputs In+ and In− of buffer 700 may be blocked by capacitor pairs C1–C3 and C2–C4. An AC signal from the differential inputs In+ and In− may then flow through capacitors C1 through C4 and may be combined at nodes "a" through "d" with biasing voltage. For example, AC signal from the differential inputs In+ and In− may pass through capacitors C1 and C2, respectively, and may be combined at nodes "a" and "b" with the DC biasing voltage from node "f." Similarly, AC signal from the differential inputs In+ and In− may pass through capacitors C3 and C4, respectively, and may be combined at nodes "c" and "d" with biasing voltage from $V_{bias}$.

As the input AC currents passing through capacitors C1 through C4 changes, the gate-to-source voltage $V_{GS}$ of transistors M1 through M4 may also change accordingly. As a result of changes in $V_{GS}$, an AC current may be generated by transistors M1 through M4. However, since transistors M1 and M3 are complementary as well as M2 and M4, an increase (or decrease) in voltage at the gates of M1 or M2 may have a different effect than the increase (or decrease) in voltage at the gates of M3 or M4. For example, as AC charge at the gates of M1 or M2 increases, AC current flowing through M1 or M2 may also increase above the nominal current level set by the dc common mode voltage from "e" supplied to the gates of M1 and M2. However, as charge at the gates of M3 or M4 increases, AC currents flowing through M3 or M4 may decrease below the nominal DC current level set by the $V_{bias}$ voltage supplied to the gates of transistors M3 and M4.

In this regard, the sum of the currents flowing through M3 and the load inductor K0 may be equal to current flowing through M1. Similarly, the sum of the currents flowing through M4 and the load inductor K0 may equal current passing through M2. Consequently, as charge accumulates at the gates of M3 or M4, current through M3 or M4 may decrease, which may cause a bigger AC current to be supplied to M1 or M2 through the load inductor K0. Since AC current generated by complementary transistors M1–M3 and M2–M4 change in the opposite directions, a bigger AC current change through the load inductor K0 may result. Therefore, the output voltage Vo+ and Vo− generated by the larger current through the load inductor K0 may be characterized by a higher swing. Higher output voltage swing may result in a higher signal gain for the buffer 700.

Even though aspects of the present invention may utilize PMOS transistors as input transconductors and a DC current source and NMOS transistors as differential buffer input transconductors, the invention may not be so limited. Accordingly, NMOS transistor may be utilized as input transconductors and a DC current source and PMOS transistors may be utilized as differential buffer input transconductors.

Figure 8:
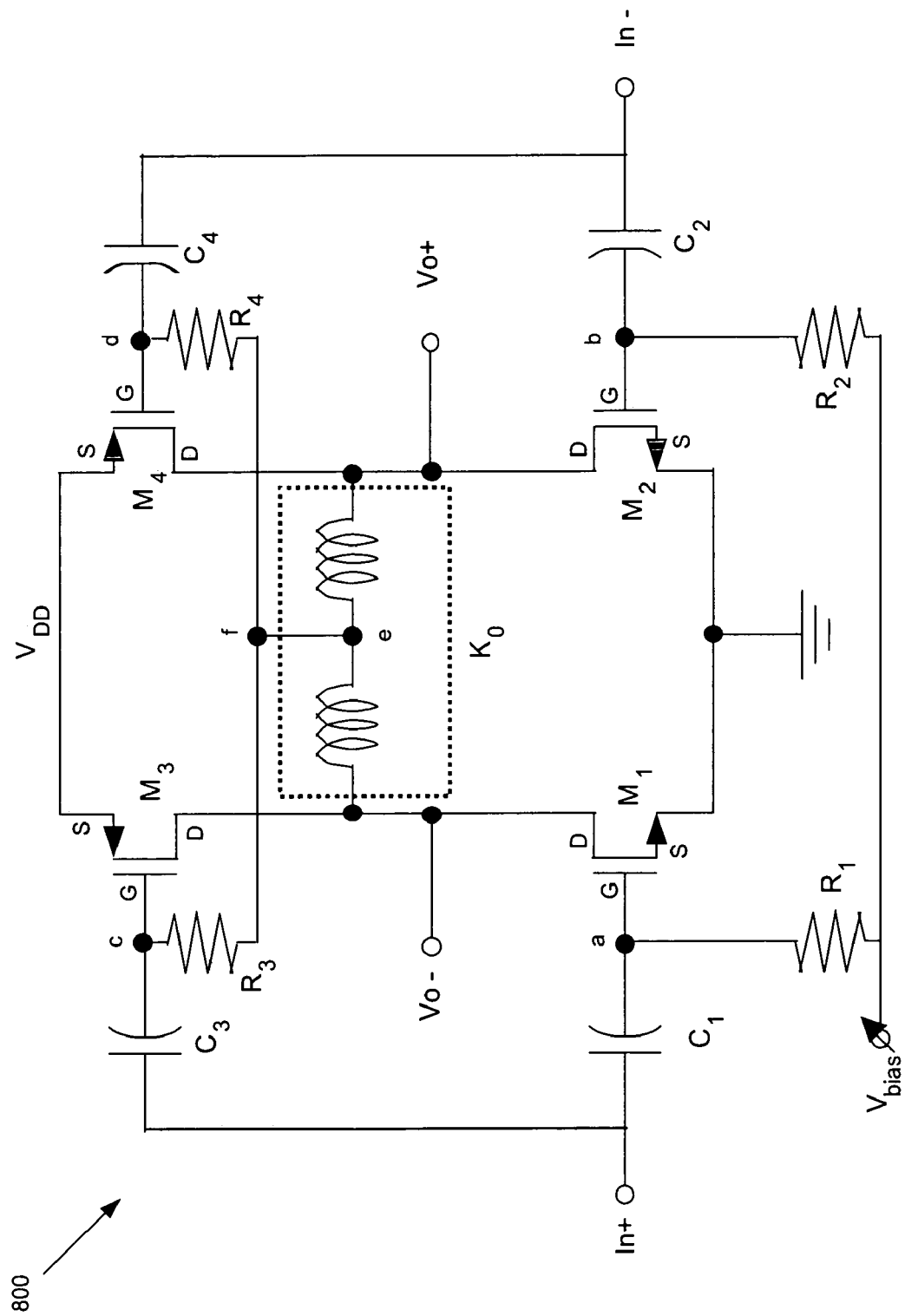
FIG. 8 is a circuit illustrating a buffer with complementary transconductors and common mode biased PMOS transistor pair, in accordance with an embodiment of the invention.

FIG. 8 is a circuit illustrating a buffer with complementary transconductors and common mode biased PMOS transistor pair, in accordance with an embodiment of the invention. Referring to FIG. 8, the buffer 800 may comprise transistors M1 through M4, resistors R1 through R4, load inductor K0, and capacitors C1 through C4. The buffer 800 may also comprise differential inputs In+ and In− and corresponding differential outputs Vo− and Vo+.

Transistors M1 and M2 may be implemented as input transconductors utilizing NMOS transistors, for example. The gates of transistors M1 and M2 may be AC coupled by the capacitors C1 and C2, respectively. By utilizing capacitors C1 and C2 after the differential inputs In+ and In−, direct current (DC) may not be conducted to the gates of transistors M1 and M2 and only alternating current (AC) may be allowed to flow through capacitors C1 and C2. In this manner, AC current from the inputs In+ and In− may flow through capacitors C1 and C2 and conducted to the gates of transistors M1 and M2. The sources of transistors M1 and M2 may be connected to ground and the drains of transistors M1 and M2 may be connected to the drains of transistors M3 and M4, respectively. Transistors M1 and M2 may be coupled to a bias gate voltage source $V_{bias}$ via resistors R1 and R2, respectively, and may be turned ON and OFF by changing the gate voltage $V_{bias}$. Resistors R1 and R2 may also be utilized to isolate nodes "a" and "b" from each other so that AC signals passing through capacitors C1 and C2 may accumulate at nodes "a" and "b" to build the required AC charge necessary for the AC current generation by M1 and M2.

In another embodiment of the invention, transistors M3 and M4 may comprise PMOS transistors and transistors M1 and M2 may comprise NMOS transistors. Further, transistors M3 and M4 may also be implemented as input transconductors and as a DC current source by connecting the sources of M3 and M4 to a DC voltage source $V_{DD}$. Transistors M3 and M4 may be implemented as transconductors by AC coupling the gates of M3 and M4 by the capacitors C3 and C4, respectively, where the capacitors C3 and C4 may be coupled to the differential input signals In+ and In−. By utilizing capacitors C3 and C4 after the differential inputs In+ and In−, direct current (DC) may not be conducted to the gates of transistors M3 and M4 and only alternating current (AC) may be allowed to pass through capacitors C3 and C4. In this manner, AC current from the inputs In+ and In− may pass through capacitors C3 and C4 and arrive at the gates of transistors M3 and M4. The drains of transistors M3 and M4 may be coupled to the output nodes of the load inductor K0, as well as to the drains of transistors M1 and M2, so that DC current may flow down from transistors M3 and M4 to the load inductor K0 and transistors M1 and M2.

The load inductor K0 may be utilized to provide high impedance at the operating frequency of the buffer 800. In this regard, the load inductor K0 may be utilized to allow any direct current coming from the DC current source transistors M3 and M4 and block any alternating current coming from the drains of transistors M3 and M4 and/or the drains of transistors M1 and M2, thus generating the output voltage Vo− and Vo+. Further, the load inductor K0 may be center-tapped for a common mode bias for the transistors M3 and M4 via the resistors R3 and R4.

Resistors R3 and R4 may be utilized to isolate the differential inputs In+ and In−, for example. Resistors R3 and R4 may also be utilized to isolate nodes "c," "d," and "f" from each other so that AC signals passing through capacitors C3 and C4 may not reach node "f" and may instead accumulate at nodes "c" and "d" to build the required AC charge necessary for the AC current generation by M3 and M4.

Since transistors M1 through M4 may be implemented as input transconductors, or voltage-to-current generators, as AC charge accumulates at the gates of transistors M1 through M4, corresponding transistor currents may also change proportionately. In order for transistors M1 through M4 to operate as transconductors, M1 through M4 may need to operate in saturation. In this regard, transistors M1 through M4 may be turned ON within the buffer 800 by adjusting their respective gate-source voltages $V_{GS}$ to be greater than a threshold voltage $V_{THR}$, or $V_{GS}>V_{THR}$. After transistors M1 through M4 are turned ON by adjusting their gate-source voltages $V_{GS}$ to be greater than a threshold voltage $V_{THR}$, transistors M1 through M4 may operate in saturation by adjusting their drain to source voltages $V_{DS}$ to be greater than their respective saturation voltages $V_{DSAT}$.

In an exemplary aspect of the invention, transistors M3 and M4 may be biased utilizing common mode feedback from a center tap node "e" of the load inductor K0. Since AC current may be blocked by the impedance of the load inductor K0, only DC current may reach node "e." DC common mode bias may, therefore, be acquired from node "e" and communicated through node "f" to nodes "c" and "d" of transistors M3 and M4. Accordingly, a DC average signal may remain at node "e" and may be utilized for common mode feedback through resistors R3 and R4 to the gates of transistors M3 and M4, respectively. In this regard, AC signal from the differential inputs In+ and In− may flow through capacitors C3 and C4 and may be combined at nodes "c" and "d" with the DC biasing voltage from node "f."

In operation, DC voltage from the differential inputs In+ and In− of buffer 800 may be blocked by capacitor pairs C1–C3 and C2–C4. AC signal from the differential inputs In+ and In− may then flow through capacitors C1 through C4 and may be combined at nodes "a" through "d" with biasing voltage. For example, AC signal from the differential inputs In+ and In− may flow through capacitors C3 and C4, respectively, and may be combined at nodes "c" and "d" with the DC biasing voltage from node "f." Similarly, AC signal from the differential inputs In+ and In− may flow through capacitors C1 and C2, respectively, and may be combined at nodes "a" and "b" with biasing voltage from $V_{bias}$.

As the input AC currents flowing through capacitors C1 through C4 changes, the gate-to-source voltage $V_{GS}$ of transistors M1 through M4 may also change accordingly. As a result of changes in $V_{GS}$, AC current may be generated by transistors M1 through M4. However, since transistors M1 and M3 are complementary as well as M2 and M4 an increase (or decrease) in voltage at the gates of M1 or M2 may have a different effect than the increase (or decrease) in voltage at the gates of M3 or M4. For example, as charge at the gates of M1 or M2 increases, AC current flowing through M1 or M2 may also increase above the nominal dc current level set by $V_{bias}$ and supplied to the gates of M3 and M4.

In this regard, the sum of the currents flowing through M3 and the load inductor K0 may equal the current flowing through M1. Similarly, the sum of the currents flowing through M4 and the load inductor K0 may equal current flowing through M2. Consequently, as charge accumulates at the gates of M3 or M4, current through M3 or M4 may decrease, which may cause a bigger AC current to be supplied to M1 or M2 through the inductor K0. Since AC current generated by each of the transistors in the complementary transistors M1–M3 and M2–M4 change in the opposite directions, a bigger AC current change through the load inductor K0 may result. Therefore, the output voltage Vo+ and Vo− generated by the larger current through the load inductor K0 may be characterized by a higher swing. Higher output voltage swing may result in a higher signal gain for the buffer 800.

Accordingly, aspects of the invention may be realized in hardware, software, firmware or a combination thereof. The invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for increasing output gain of an electronic circuit, the method comprising:
   receiving an input differential signal at a first pair of transistors and a second pair of transistors;
   inductively loading said first pair of transistors and said second pair of transistors;
   self-biasing said first pair of transistors via said inductive loading; and
   generating DC current via said second pair of transistors, wherein said inductive loading is performed by an inductive load directly coupled to said first pair of transistors and said second pair of transistors.

2. The method according to claim 1, further comprising configuring said first pair of transistors as input transconductors.

3. The method according to claim 1, further comprising configuring said second pair of transistors as input transconductors.

4. The method according to claim 1, further comprising configuring a pair of inductors for said inductive loading.

5. The method according to claim 4, further comprising tapping said configured pair of inductors for said self-biasing.

6. The method according to claim 1, wherein when said first pair of transistors comprises NMOS transistors, then said second pair of transistors are PMOS transistors.

7. The method according to claim 1, wherein when said first pair of transistors comprises PMOS transistors, then said second pair of transistors are NMOS transistors.

8. An apparatus for increasing output gain of an electronic circuit, the apparatus comprising:
   a first pair of transistors and a second pair of transistors that each receives an input differential signal;
   an inductive load that inductively loads said first pair of transistors and said second pair of transistors;
   said inductive load self-biases said first pair of transistors; and
   said second pair of transistors generates DC current, wherein said inductive load is directly coupled to said first pair of transistors and said second pair of transistors.

9. The apparatus according to claim 8, wherein said first pair of transistors is configured as input transconductors.

10. The apparatus according to claim 8, wherein said second pair of transistors is configured as input transconductors.

11. The apparatus according to claim 8, wherein said inductive load further comprises a pair of inductors for said inductive loading.

12. The apparatus according to claim 11, further comprising a tap that taps said configured pair of inductors for said self-biasing.

13. The apparatus according to claim 8, wherein said second pair of transistors are PMOS transistors, when said first pair of transistors comprises NMOS transistors.

14. The apparatus according to claim 8, wherein said second pair of transistors are NMOS transistors, when said first pair of transistors comprises PMOS transistors.

15. An apparatus for increasing gain for an electric circuit, the apparatus comprising:
   a first transistor, wherein a gate of said first transistor is coupled to a first differential input;
   a second transistor, wherein a gate of said second transistor is coupled to a second differential input;
   a third transistor, wherein a gate of said third transistor is coupled to said first differential input; and
   a fourth transistor, wherein a gate of said fourth transistor is coupled to said second differential input, wherein:
      said first transistor and said second transistor are biased by a common mode output of a direct current (DC) voltage source;
      said DC voltage source is coupled to said third transistor and said fourth transistor; and
      said common mode output of said DC voltage source is coupled to said gate of said first transistor and said gate of said second transistor.

16. The apparatus according to claim 15, wherein said first transistor and said second transistor comprise NMOS transistors.

17. The apparatus according to claim 15, wherein said first transistor and said second transistor comprise PMOS transistors.

18. The apparatus according to claim 15, wherein said third transistor and said fourth transistor comprise PMOS transistors, when said first transistor and said second transistor comprise NMOS transistors.

19. The apparatus according to claim 15, wherein said third transistor and said fourth transistor comprise NMOS transistors, when said first transistor and said second transistor comprise PMOS transistors.

20. The apparatus according to claim 15, further comprising a load inductor coupled to said DC voltage source.

21. The apparatus according to claim 15, wherein a first terminal of a first resistor is coupled to said gate of said first transistor.

22. The apparatus according to claim 21, wherein a second terminal of said first resistor is coupled to said common mode output of said DC voltage source.

23. The apparatus according to claim 15, wherein a first terminal of a second resistor is coupled to said gate of said second transistor.

24. The apparatus according to claim 23, wherein a second terminal of said second resistor is coupled to said common mode output of said DC voltage source.

25. The apparatus according to claim 15, wherein a first terminal of a load inductor is coupled to a drain of said first transistor and a drain of said third transistor.

26. The apparatus according to claim 15, wherein a second terminal of a load inductor is coupled to a drain of said second transistor and a drain of said fourth transistor.

27. The apparatus according to claim 15, wherein said gate of said first transistor is coupled to a first capacitor.

28. The apparatus according to claim 15, wherein said gate of said second transistor is coupled to a second capacitor.

29. The apparatus according to claim 15, wherein said gate of said third transistor is coupled to a third capacitor.

30. The apparatus according to claim 15, wherein said gate of said fourth transistor is coupled to a fourth capacitor.

31. The apparatus according to claim 15, wherein a source of said first transistor and a source of said second transistor are coupled to ground.

32. An apparatus for increasing gain for an electric circuit, the apparatus comprising:
a first transistor, wherein a gate of said first transistor is coupled to a first differential input;
a second transistor, wherein a gate of said second transistor is coupled to a second differential input;
a third transistor, wherein a gate of said third transistor is coupled to said first differential input; and
a fourth transistor, wherein a gate of said fourth transistor is coupled to said second differential input, wherein:
said third transistor and said fourth transistor are biased by a common mode output of a direct current (DC) voltage source;
said DC voltage source is coupled to said third transistor and said fourth transistor; and
said common mode output of said DC voltage source is coupled to said gate of said third transistor and said gate of said fourth transistor.

33. A method for increasing output gain of an electronic circuit, the method comprising:
receiving an input differential signal at a first pair of transistors and a second pair of transistors;
inductively loading said first pair of transistors and said second pair of transistors;
self-biasing said first pair of transistors via said inductive loading; and
generating DC current via said second pair of transistors, wherein when said first pair of transistors comprises NMOS transistors, then said second pair of transistors are PMOS transistors.

34. A method for increasing output gain of an electronic circuit, the method comprising:
receiving an input differential signal at a first pair of transistors and a second pair of transistors;
inductively loading said first pair of transistors and said second pair of transistors;
self-biasing said first pair of transistors via said inductive loading; and
generating DC current via said second pair of transistors, wherein when said first pair of transistors comprises PMOS transistors, then said second pair of transistors are NMOS transistors.

35. An apparatus for increasing output gain of an electronic circuit, the apparatus comprising:
a first pair of transistors and a second pair of transistors that each receives an input differential signal;
an inductive load that inductively loads said first pair of transistors and said second pair of transistors;
said inductive load self-biases said first pair of transistors; and
said second pair of transistors generates DC current,
wherein said second pair of transistors are PMOS transistors, when said first pair of transistors comprises NMOS transistors.

36. An apparatus for increasing output gain of an electronic circuit, the apparatus comprising:
a first pair of transistors and a second pair of transistors that each receives an input differential signal;
an inductive load that inductively loads said first pair of transistors and said second pair of transistors;
said inductive load self-biases said first pair of transistors; and
said second pair of transistors generates DC current,
wherein said second pair of transistors are NMOS transistors, when said first pair of transistors comprises PMOS transistors.

37. An apparatus for increasing gain for an electric circuit, the apparatus comprising:
a first transistor, wherein a gate of said first transistor is coupled to a first differential input;
a second transistor, wherein a gate of said second transistor is coupled to a second differential input;
a third transistor, wherein a gate of said third transistor is coupled to said first differential input; and
a fourth transistor, wherein a gate of said fourth transistor is coupled to said second differential input, wherein:
said first transistor and said second transistor are biased by a common mode output of a direct current (DC) voltage source;
said DC voltage source is coupled to said third transistor and said fourth transistor;
said common mode output of said DC voltage source is coupled to said gate of said first transistor and said gate of said second transistor; and
wherein said third transistor and said fourth transistor comprise PMOS transistors, when said first transistor and said second transistor comprise NMOS transistors.

38. An apparatus for increasing gain for an electric circuit, the apparatus comprising:
a first transistor, wherein a gate of said first transistor is coupled to a first differential input;
a second transistor, wherein a gate of said second transistor is coupled to a second differential input;
a third transistor, wherein a gate of said third transistor is coupled to said first differential input; and
a fourth transistor, wherein a gate of said fourth transistor is coupled to said second differential input, wherein:
said first transistor and said second transistor are biased by a common mode output of a direct current (DC) voltage source;

said DC voltage source is coupled to said third transistor and said fourth transistor;

said common mode output of said DC voltage source is coupled to said gate of said first transistor and said gate of said second transistor; and wherein said third transistor and said fourth transistor comprise NMOS transistors, when said first transistor and said second transistor comprise PMOS transistors.

39. An apparatus for increasing gain for an electric circuit, the apparatus comprising:

a first transistor, wherein a gate of said first transistor is coupled to a first differential input;

a second transistor, wherein a gate of said second transistor is coupled to a second differential input;

a third transistor, wherein a gate of said third transistor is coupled to said first differential input;

a fourth transistor, wherein a gate of said fourth transistor is coupled to said second differential input, wherein:

said first transistor and said second transistor are biased by a common mode output of a direct current (DC) voltage source;

said DC voltage source is coupled to said third transistor and said fourth transistor;

said common mode output of said DC voltage source is coupled to said gate of said first transistor and said gate of said second transistor; and a load inductor coupled to said DC voltage source.

40. An apparatus for increasing gain for an electric circuit, the apparatus comprising:

a first transistor, wherein a gate of said first transistor is coupled to a first differential input;

a second transistor, wherein a gate of said second transistor is coupled to a second differential input;

a third transistor, wherein a gate of said third transistor is coupled to said first differential input;

a fourth transistor, wherein a gate of said fourth transistor is coupled to said second differential input, wherein:

said first transistor and said second transistor are biased by a common mode output of a direct current (DC) voltage source;

said DC voltage source is coupled to said third transistor and said fourth transistor;

said common mode output of said DC voltage source is coupled to said gate of said first transistor and said gate of said second transistor; and wherein a first terminal of a first resistor is coupled to said gate of said first transistor.

41. The apparatus according to claim 40, wherein a second terminal of said first resistor is coupled to said common mode output of said DC voltage source.

42. An apparatus for increasing gain for an electric circuit, the apparatus comprising:

a first transistor, wherein a gate of said first transistor is coupled to a first differential input;

a second transistor, wherein a gate of said second transistor is coupled to a second differential input;

a third transistor, wherein a gate of said third transistor is coupled to said first differential input;

a fourth transistor, wherein a gate of said fourth transistor is coupled to said second differential input, wherein:

said first transistor and said second transistor are biased by a common mode output of a direct current (DC) voltage source;

said DC voltage source is coupled to said third transistor and said fourth transistor;

said common mode output of said DC voltage source is coupled to said gate of said first transistor and said gate of said second transistor; and wherein a first terminal of a second resistor is coupled to said gate of said second transistor.

43. The apparatus according to claim 42, wherein a second terminal of said second resistor is coupled to said common mode output of said DC voltage source.

44. An apparatus for increasing gain for an electric circuit, the apparatus comprising:

a first transistor, wherein a gate of said first transistor is coupled to a first differential input;

a second transistor, wherein a gate of said second transistor is coupled to a second differential input;

a third transistor, wherein a gate of said third transistor is coupled to said first differential input;

a fourth transistor, wherein a gate of said fourth transistor is coupled to said second differential input, wherein:

said first transistor and said second transistor are biased by a common mode output of a direct current (DC) voltage source;

said DC voltage source is coupled to said third transistor and said fourth transistor;

said common mode output of said DC voltage source is coupled to said gate of said first transistor and said gate of said second transistor; and wherein a first terminal of a load inductor is coupled to a drain of said first transistor and a drain of said third transistor.

45. An apparatus for increasing gain for an electric circuit, the apparatus comprising:

a first transistor, wherein a gate of said first transistor is coupled to a first differential input;

a second transistor, wherein a gate of said second transistor is coupled to a second differential input;

a third transistor, wherein a gate of said third transistor is coupled to said first differential input; and a fourth transistor, wherein a gate of said fourth transistor is coupled to said second differential input, wherein:

said first transistor and said second transistor are biased by a common mode output of a direct current (DC) voltage source;

said DC voltage source is coupled to said third transistor and said fourth transistor;

said common mode output of said DC voltage source is coupled to said gate of said first transistor and said gate of said second transistor; and wherein a second terminal of a load inductor is coupled to a drain of said second transistor and a drain of said fourth transistor.

\* \* \* \* \*